(12) United States Patent
Obidat et al.

(10) Patent No.: US 10,705,136 B2
(45) Date of Patent: Jul. 7, 2020

(54) MODULAR TEST ASSEMBLY

(71) Applicant: TEXAS INSTRUMENTS INCORPORATED, Dallas, TX (US)

(72) Inventors: Abdallah Obidat, Santa Clara, CA (US); William Gauspohl, Richardson, TX (US); Florent Boico, Oakland, CA (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 96 days.

(21) Appl. No.: 16/148,505

(22) Filed: Oct. 1, 2018

(65) Prior Publication Data

US 2020/0103460 A1 Apr. 2, 2020

(51) Int. Cl.
*G01R 31/28* (2006.01)
*H01R 12/75* (2011.01)
*H01R 12/52* (2011.01)

(52) U.S. Cl.
CPC ..... *G01R 31/2834* (2013.01); *G01R 31/2851* (2013.01); *H01R 12/52* (2013.01); *H01R 12/75* (2013.01)

(58) Field of Classification Search
CPC ..... G01R 31/2851; H01R 12/52; H01R 12/75
See application file for complete search history.

(56) References Cited

U.S. PATENT DOCUMENTS

| 2015/0145548 A1* | 5/2015 | Duncan | G01R 31/31905 324/756.05 |
| 2016/0259752 A1* | 9/2016 | Brodbeck | G06F 13/4072 |
| 2017/0184672 A1* | 6/2017 | Song | G06F 11/273 |
| 2019/0187203 A1* | 6/2019 | Chang | G01R 31/2806 |

* cited by examiner

*Primary Examiner* — Alvaro E Fortich
(74) *Attorney, Agent, or Firm* — Mark Allen Valetti; Charles A. Brill; Frank D. Cimino (57) ABSTRACT

A test assembly includes multiple circuit boards. Each board includes multiple pairs of contacts configurable to address the respective circuit board, an instrument, first and second headers at opposing edges of the respective board. Each pin of a first header electrically connects through the board to a corresponding pin of a second header. Each board includes first and second input/output (I/O) terminals at opposing edges of the respective board, the first I/O terminal electrically connects through the board to the second I/O terminal. A relay on the board permits the board's instrument to be activated. Each of the circuit boards mechanically and electrically connects to another circuit board through a jumper cable connecting the first header of one circuit board to the second header of another circuit board and through a conductive member electrically connecting the first I/O terminal of one board to the second I/O terminal of another board.

21 Claims, 5 Drawing Sheets

MODULAR TEST ASSEMBLY

BACKGROUND

Validation testing of a device (e.g., an integrated circuit (IC)) may entail testing the IC while operating the IC at a range of supply voltages, a range of temperatures, with a variety of different loads connected to the IC, etc.

SUMMARY

A test assembly includes multiple circuit boards. Each board includes multiple pairs of contacts configurable to address the respective circuit board, an instrument, first and second headers at opposing edges of the respective board. Each pin of a first header electrically connects through the board to a corresponding pin of a second header. Each board includes first and second input/output (I/O) terminals at opposing edges of the respective board, the first I/O terminal electrically connects through the board to the second I/O terminal. A relay on the board permits the board's instrument to be activated. Each of the circuit boards mechanically and electrically connects to another circuit board through a jumper cable connecting the first header of one circuit board to the second header of another circuit board and through a conductive member electrically connecting the first I/O terminal of one board to the second I/O terminal of another board.

BRIEF DESCRIPTION OF THE DRAWINGS

For a detailed description of various examples, reference will now be made to the accompanying drawings in which.

DETAILED DESCRIPTION

The described examples pertain to a test assembly in which an electrical device such as an integrated circuit (IC) can be automatically (i.e., without human involvement) tested while connecting multiple different instruments to the electrical device. The term "instrument" refers to any type of device or resource that can be applied or coupled to the device to be tested. Examples of instruments include power supplies, loads, measurement devices (e.g., current measurement devices such as sense resistors), digital multimeters, oscilloscopes, function generators, spectrum and frequency response analyzers, etc. Each instrument is attached to (e.g., mounted on or otherwise electrically connected to) a separate printed circuit board (PCB) assembly and multiple such PCB assemblies are used to test the device. Each PCB assembly has a common form factor that facilitates the outputs of the various instruments being electrically connected together as the PCBs themselves are attached to one another. As a result of the form factor employed for the PCBs, the test assembly is modular and scalable. Additional instruments can be added to the test assembly by attaching additional PCB assemblies to the existing PCB assemblies and thus without the need to redesign and rebuild the test assembly from scratch.

Figure 1:
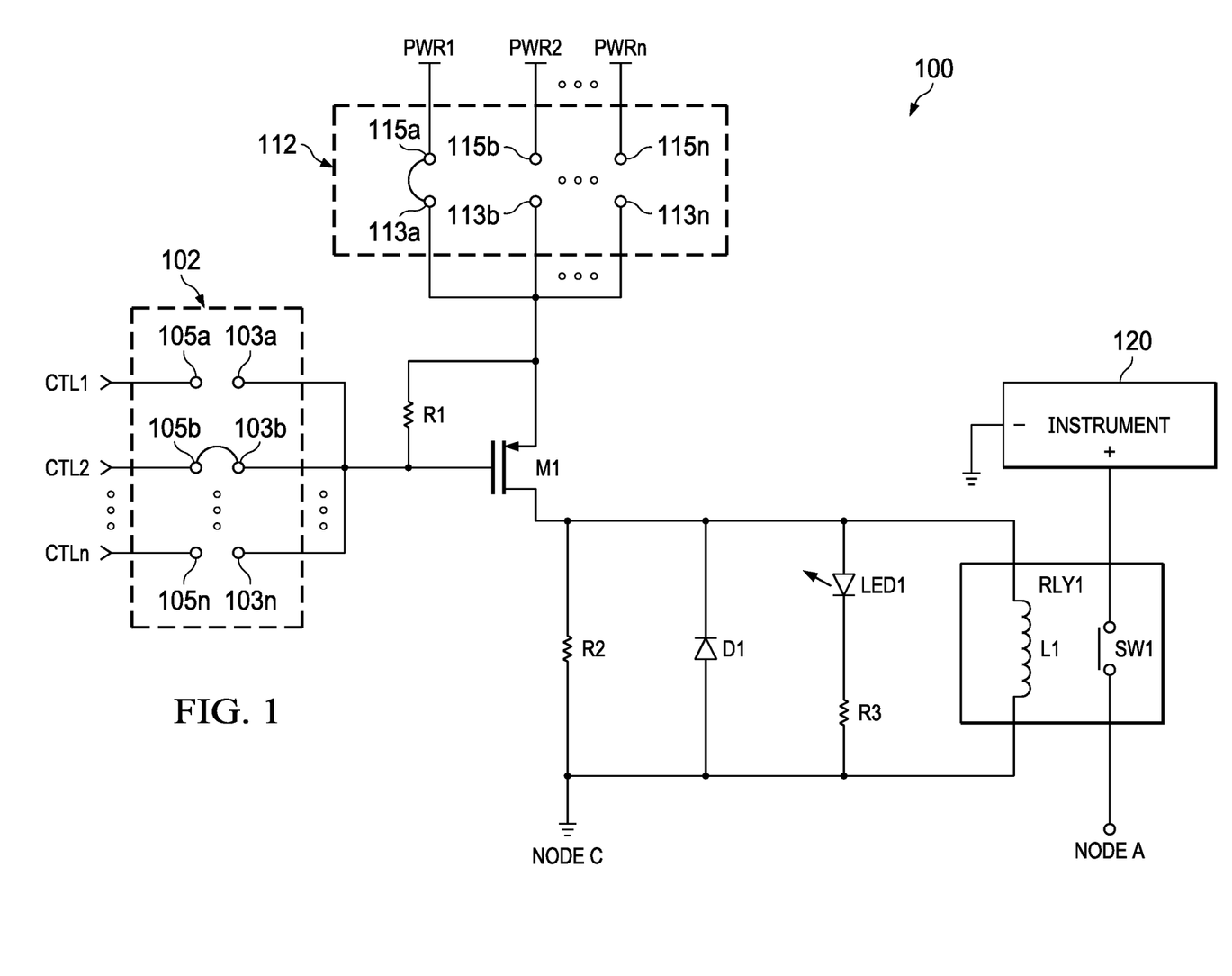
FIG. 1 illustrates a printed circuit board assembly in accordance with an example.

FIG. 1 shows an example implementation of a PCB assembly 100. In this example, the PCB assembly 100 includes a plurality of pairs of electrically connectable contacts 102, a plurality of pairs of electrically connectable contacts 112, a transistor resistors R1, R2, and R3, a diode D1, a light emitting diode LED1, a relay RLY1 and an instrument 120. The plurality of pairs of electrically connectable contacts 102 comprise contacts $103a/105a$, $103b/105b$, . . . , $103n/105n$. Contact $103a$ can be electrically connected to contact $105a$. Similarly, contact $103b$ can be electrically connected to contact $105b$ and contact $103n$ can be connected to electrically contact $105b$. In the example of FIG. 1, contact $103b$ is connected to contact $105b$. Each pair of corresponding contacts can be implemented as a dip switch, a pair of contacts connectable by a conductive jump, etc. Similarly, the contacts $113a$, $113b$, . . . , $113n$ can be individually connected to their corresponding contacts $115a$, $115b$, . . . , $115n$. Contact pairs $113a/115b$, $113b/115b$, . . . , $113n/115n$ also can be implemented as a dip switch, a pair of contacts connectable by a conductive jump, etc.

Transistor M1 in this example comprises a p-type metal oxide semiconductor field effect transistor (PMOS transistor), but can be implemented as an n-type metal oxide semiconductor field effect transistor or other type of transistor (e.g., bipolar junction transistor) in other embodiments. Transistor M1 includes a control input and first and second current terminals. As a PMOS transistor, the control input is a gate and the first and second current terminals are the drain and source. R1 connects between the gate and source of M1 to ensure that the gate of M1 is at a known voltage (high) when the control lines are high impedance and allows the control line to influence the gate of the transistor without disturbing the source. The gate of M1 also connects to each contact $103a$-$103n$. A control signal (CTL1, CTL2, . . . , CTLn) provided to a contact $105a$-$105n$ is also provided to the gate of M1 if the corresponding contacts 103/105 are electrically connected together. In the example of FIG. 1, CTL2 is provided to the gate of M1. The source of M1 also connects to the contacts $113a$-$113n$. A supply voltage (PWR1, PWR2, . . . , PWRn) provided to a contact $115a$-$115n$ is also provided to the source of M1 if the corresponding contacts 113/115 are electrically connected together. In the example of FIG. 1, PWR1 is provided to the source of M1.

R2 connects between the drain of M1 and a ground node (Node C) and ensures that the drain is at a known voltage (e.g., ground). The resistance of R2 does not affect M1 being turned on as the current from M1 will flow to the relay's coil L1 which is a lower resistance than R2. Diode D1 also connects between the drain of M1 and the ground node. Diode D1 functions a freewheeling diode (also referred to as a snubber diode, flyback diode, or suppressor diode) to prevent damage to the circuit due to possible voltage spikes from an inductive load (e.g., the coil of RLY1) when the supply current is abruptly reduced.

The relay RLY1 includes a coil L1 and a switch SW1. When sufficient current from the power source (PWR1, PWR2, etc.) flows through M1 and coil L1, a magnetic field causes the switch SW1 to close thereby connecting the positive terminal of the instrument 120 to Node A. When the relay coil L1 is energized, LED1 illuminates as well to provide visual status of the instrument. Resistor R3 limits the current through LED1 to an appropriate level.

A test assembly may include one or more PCB assemblies 100. In examples in which the test assembly includes multiple PCB assemblies 100, each PCB assembly 100 has a different instrument 120 (e.g., different power supply voltage for the device under test, different load device, etc.). Each PCB assembly 100 is individually addressable to cause its instrument 120 to be coupled to the device under test through Node A. Prior to operation of the test assembly, a specific contact 105a-105n of a given PCB assembly 100 is electrically connected to a corresponding contact 103a-103n. In some implementations, only one pair of contacts 103/105 on a given PCB assembly is electrically shorted together and only one pair of contacts 113/115 is electrically connected together (although the same 113/115 contact pair across the multiple PCB assemblies 100 can be connected together). A computer (shown in FIG. 4) directly or indirectly controls the various control signals CTL1-CTLn.

When M1 is turned on via a suitable gate-to-source voltage, current flows to L1 of relay RLY1 thereby energizing the relay and causing SW1 to close. With SW1 closed, the instrument 120 is electrically coupled to node Node A. M1 is thus used to sink current through the relay coil L1 rather than through a relay driver, which allows for relatively thin signal traces. If, for a specific test of the device under test, instrument 120 in FIG. 1 is to be coupled to the device under test, then the computer causes CTL2 to be asserted (low in this example in which M1 is a PMOS transistor). CTL2 is provided to all of the printed circuit board assemblies 100 but only the one board for which contact 105b is connected to contact 103b will permit CTL2 to be routed through to the gate of M1 and thus only that particular board will have its relay RLY1 energized to thereby couple its instrument 120 to node A (and thus to the device under test as described below).

Figure 2:
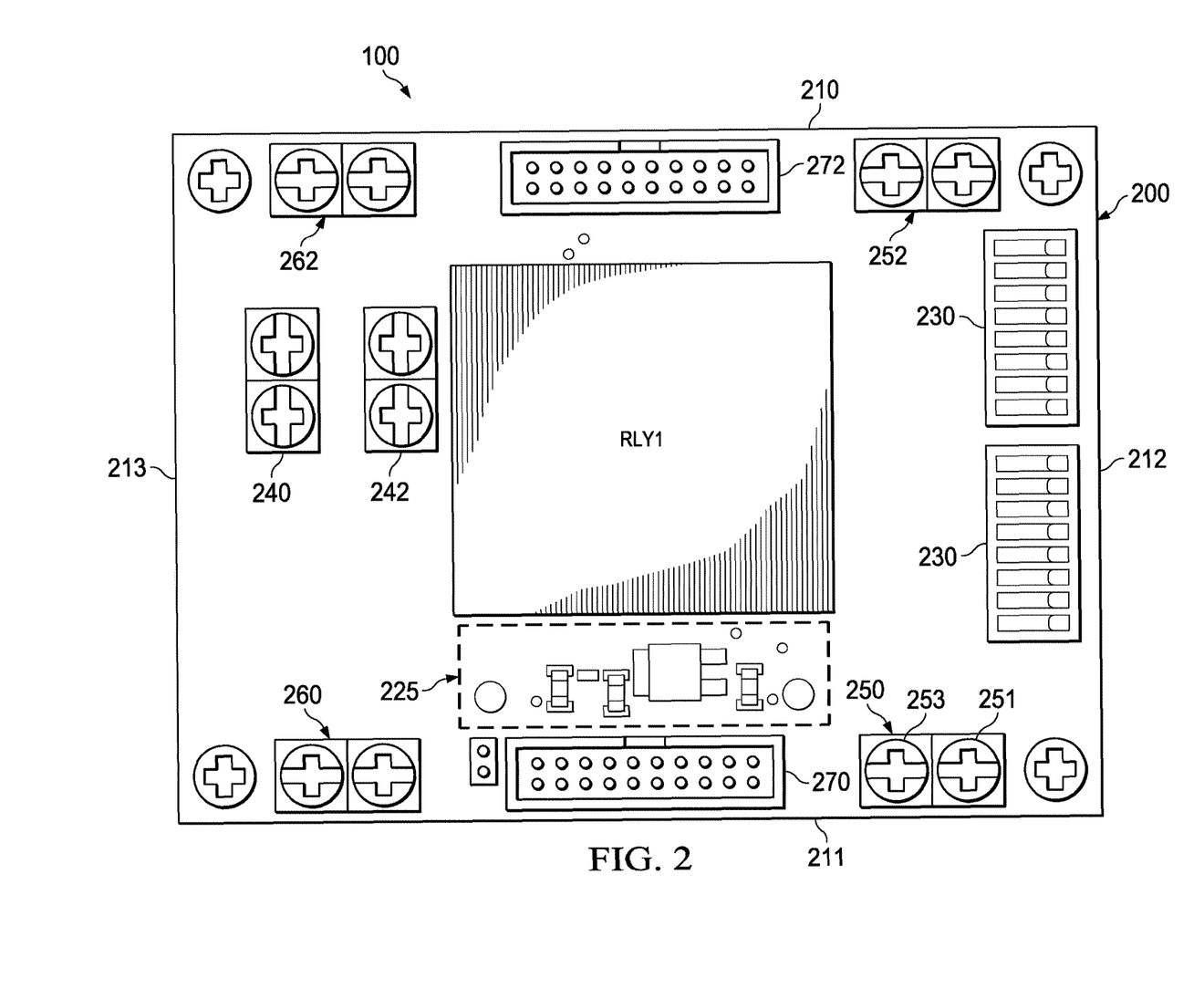
FIG. 2 shows an example of a layout configuration of the printed circuit board assembly.

FIG. 2 shows an example form factor and layout of each PCB assembly 100. The PCB assembly includes a PCB 200 (e.g., a single or multi-layer PCB) comprising edges 210, 211, 212, and 213. Edges 210 and 211 oppose each other and edges 212 and 213 oppose each other. Attached (e.g., soldered) to the PCB 200 are the relay RLY1, circuit components 225 (e.g., M1, R1-R3, D1, and LED1), dip switches 230, electrical contact 240 for the negative terminal of an instrument (the instrument is not shown in FIG. 2), electrical contact 242 for the positive terminal of the instrument, electrical contacts 250, 252, 260, and 262, and multi-pin header connectors 270 and 272.

Through traces in the PCB 200, electrical contact 250 is electrically connected to node A (FIG. 1) and to one terminal of the switch SW1 within RLY1. Contact 250 is an input/output (I/O) terminal. Two screws 251 and 253 are shown in this example and the screws 251, 253 are electrically shorted together thereby forming Node A. Electrical contact 250 is electrically connected to contact 252 (also an I/O terminal) at opposing edge 210 through the PCB 200. Similarly, electrical contact 260 (Node C, ground) is electrically connected to contact 262 through the PCB 200. Each pin of multi-pin header connector 270 is electrically connected to a corresponding pin of multi-pin header connector 272 through the PCB 200. For example, pin 1 of connector 270 is connected to pin 1 of connector 272, pin 2 to pin 2, and so on.

Electrical contacts 250 and 260 and multi-pin header connector 270 are provided on the PCB 200 at edge 210, and electrical contacts 252 and 262 and multi-pin header connector 272 are provided on the PCB 200 at opposing edge 211. Being provided at the edge of the PCB means that the component is at or near the edge. In one example, being "near" the edge includes having less than 5 mm of PCB exposed between the edge of the PCB and an edge of the component.

The example of FIG. 2 shows an implementation of the electrically connectable contacts 102 and 112 as dip switches 230. In this example, the dip switches 230 are implemented as two sets of 8 dip switch devices, but fewer or more than 8 dip switches is possible in other examples. At least some of the pins of each multi-pin header connector 270, 272 are electrically connected through the PCB to corresponding contacts within the dip switches 230, in addition to being connected to each other as explained above.

Figure 3:
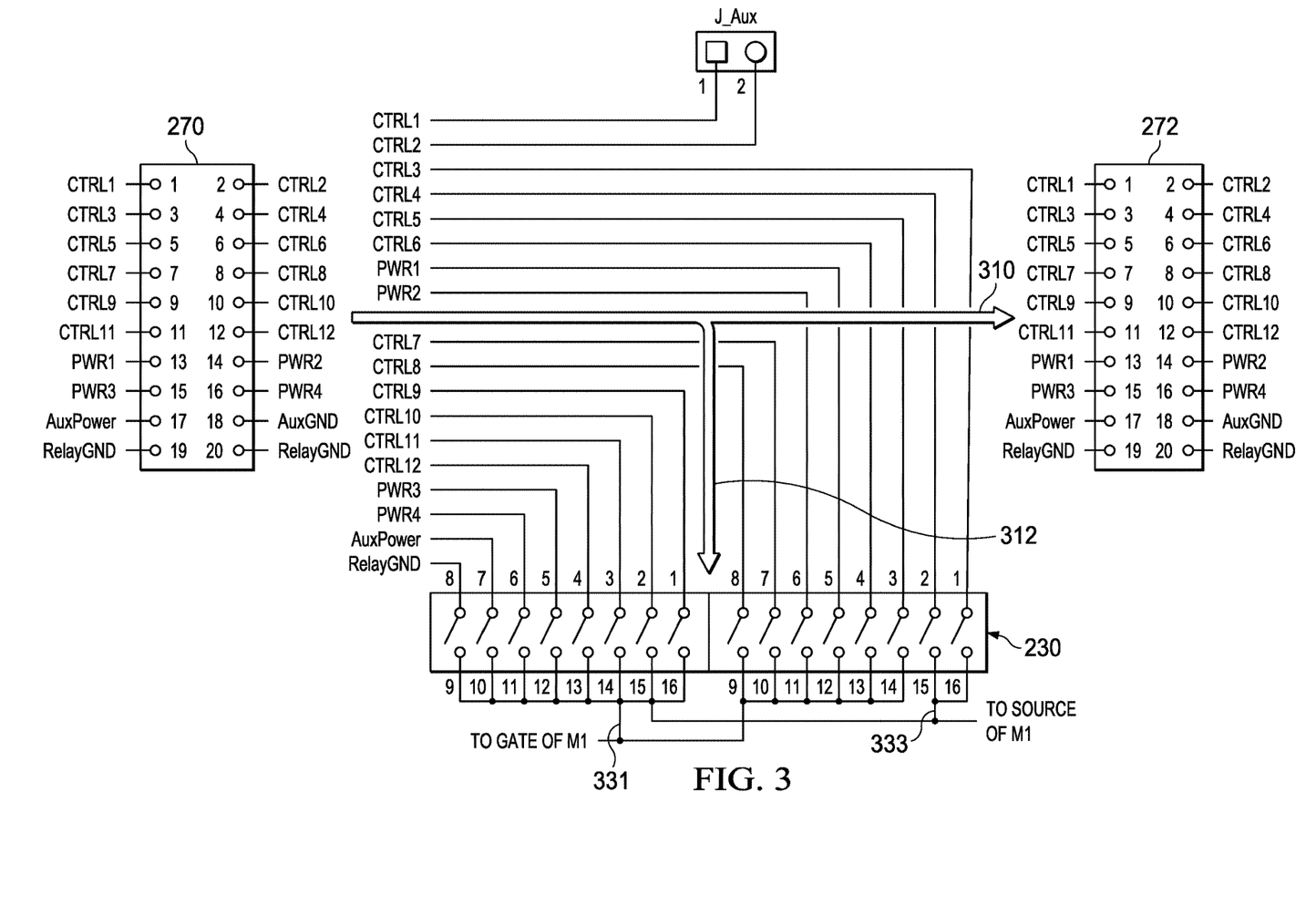
FIG. 3 illustrates the connection between connectors on the printed circuit board assembly.

FIG. 3 illustrates the connections through the PCB 200 of the multi-pin header connectors 270, 272 and the dip switches 230. Multi-pin header connector 270 in this example includes pins for each of 12 control signals (CTL1-CTL12), four supply voltages (PWR1-PWR4), and auxiliary (AUX) power and AUX ground and relay ground. Arrow 310 indicates that each of the 12 control signal pins, four supply voltage pins, auxiliary and relay pins of connector 270 is connected through the PCB 200 to corresponding pins of multi-pin header connector 272. Arrow 312 illustrates that some of the pins of the multi-pin header connectors are also connected to the dip switches 230. There are 16 dip switches in this example and the 12 control signal pins CTL1-CTL12 and the four supply voltage pins PWR1-PWR4 are also connected through PCB 200 to corresponding dip switches 230. For the 12 dip switch pins connected to the 12 control signal pins of the header connectors 270, 272, the opposing dip switch pins are electrically connected together forming node 331 and the gate of M1 also is connected to node 331. Similarly, for the 4 dip switch pins connected to the 4 supply voltage pins of the header connectors, the opposing dip switch pins are electrically connected together forming node 333 and the source of M1 also is connected to node 333. The AUX pins provided on each PCB may be used to power other individual sub-circuits or custom instrumentation or a fan, or even used for the relay ground. The AUX GND signal may be kept separate from the system ground to avoid ground bounce and maintain a clean ground signal, if needed.

Figure 4:
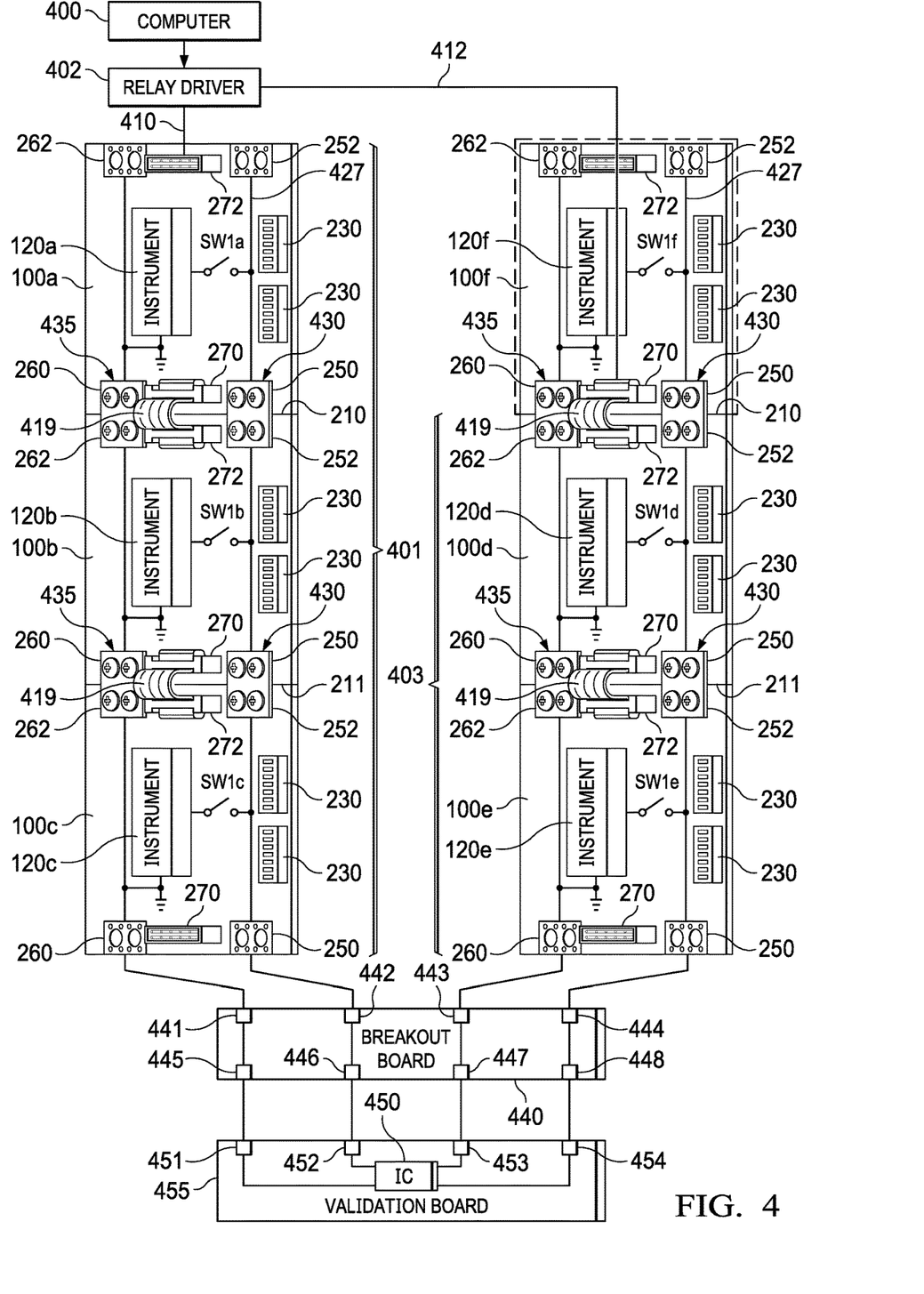
FIG. 4 shows an example of a test assembly comprising multiple printed circuit board assemblies.

FIG. 4 shows an example of a test assembly for testing an IC 450 provided on a validation board 455. The test assembly in this example includes two sets 401 and 403 of PCB assemblies 100, also referred to as "columns" of PCBs, a breakout board 440, a validation board 455, a computer 400 and a relay driver 402. The first set 401 includes PCB assemblies 100a, 100b, and 100c. The second set 403 includes PCBs 100d and 100e. In one implementation each PCB assembly 100a-100e is implemented as shown in FIGS. 1-3. PCB assembly 100a is attached to PCB assembly 100b, and PCB assembly 100b is attached to PCB assembly 100c to form the first set 401. A pair of PCBs are attached to another through conductive members 430 and 435. Each conductive member 430, 435 comprises, for example, a conductive metal plate with holes through which the screws comprising the corresponding contacts can be inserted and tightened. As such, conductive member 430 mechanically connects two adjacent PCBs together and electrically connects contact 250 at the bottom edge 210 of one board to contact 252 at the top edge 210 of the next board. Similarly, conductive member 435 also helps to mechanically connect two adjacent PCBs together and electrically connects contact 260 at the bottom edge of one board to contact 262 at the top edge of the next board. The placement of the electrical contacts 250, 252, 260, and 262 at the opposing edges 210, 211 of the PCB assemblies 100 facilitates their connection as shown in FIG. 4.

Once the conductive members 430 are used to connect together corresponding contacts 250 and 252 of adjacent boards within the first set 401, because the contacts 250 and 252 on each PCB are connected together through the PCB 200, the relay switches SW1a, SW1b, and SW1c are electrically connected together as shown as represented by line 427. As such, by selection and closure of the appropriate dip switches 230 (as explained above) any of the instruments on the PCB assemblies 100 of the first set 401 can be electrically coupled, by energizing their respective relay coils L1, through the breakout board 440 to a pin 442 on the validation board 450. Contacts 260 and 262 electrically connect to the ground node (Node C in FIG. 1). Through the board-to-board connection of contacts 260 and 262 via conductive members 435, the ground node (Node C) runs continuously through the series of PCB assemblies 100a-100c as represented by line 429. The second set 403 of PCB assemblies 100d and 100e is similarly configured and connected together via conductive members 430 and 435. The The breakout board 440 comprises input contacts 441, 442, 443, and 444 and output contacts 445, 446, 447, and 448. Each input contacts is connected to a corresponding contact on one of the PCB assemblies 100 within each set 401, 403 of PCBs 100. Because the PCB assemblies 100 the contacts are electrically connected together between adjacent PCBs as described above, electrical contact 260 of PCB assembly 100c within the first set 401 provides the ground reference for PCB assemblies 100a-100c of the first set 401, and electrical contact 250 of PCB assembly 100c provides the common signal point for the output of whichever instrument 120a-120c is activated within the first set 401 (i.e., the instrument 120 of the PCB assembly 100 whose relay coil L1 has been energized). Similarly, connections are provided between input contacts 443 and 444 of the breakout board 440 to electrical contacts 260 and 250 of PCB assembly 100e.

The breakout board 440 provides electrical connectivity between its input contacts 441-444 and its output contacts 445-448 as shown. The output contacts 445-448 of the breakout board 440 are connected to corresponding input contacts 451-455 on the validation board 455 which contains the IC 450 (or other type of device to be tested). The input contacts 451-454 are electrically connected through the validation board 455 to the IC 450. As such, any of the instruments 120 in the first set 401 can be electrically connected to the IC 450 and similarly any of the instruments 120 in the second set 403 also can be electrically connected to the IC 450.

The instruments 120 in the first set 401 may comprise different power supplies (e.g., different supply voltages) and the instruments 120 in the second set 403 may comprise different types of loads. By activation of the relays (RLY1) on certain PCB assemblies 100, a particular combination of instruments 120 can be electrically connected to the IC 450, for example, for, validation testing purposes.

The computer 400 comprises a processor and storage (e.g., memory, magnetic storage, a solid state storage drive, etc.). The storage contains software which, when executed by the processor, causes the processor to perform various operations. For example, the computer 400 may execute a testing program in which the IC 450 is tested with different combinations of instruments (e.g., different supply voltages and different loads for each supply voltage). Computer 400 connects to a relay driver 402 and the relay driver connects to the header connectors 272 of PCB assemblies 100a and 100d via cables 410 and 412. In one example, ribbon cables are used to connect the relay driver 402 to the respective PCB assemblies 100. The pins of header connectors 272 connect through each PCB assembly 100 to the opposing header connector 270. Jumper cables 419 then connect the header connector 270 at the bottom edge of one board to the header connector 272 at the top edge of the next board as shown. As such, a signal on any of the conductors in cable 410 connects to the corresponding pins in each of the header connectors 270/272 of PCB assemblies 100a-100c. Similarly, a signal on any of the conductors in cable 412 connects to the corresponding pins in each of the header connectors 270/272 of PCB assemblies 100d and 100e.

The relay driver 402 receives commands, signals, etc. from computer 400. The commands, signals, etc. from the computer 400 specify, or otherwise indicates which PCB assembly's instrument 120 is to be enabled and connected to the IC 450. The dip switches 230 of the various PCB assemblies 100 are set so that each given control signal is routed to the gate of M1 of a particular PCB assembly 100. The relay driver 402 responds to commands/signals from computer 400 by driving an appropriate voltage level on a particular conductor in cables 410, 412 to cause the RLY1 associated with the target instrument 120 to be energized (as explained above with regard to FIG. 1). The relay driver 402 includes multiple open-drain connections. Energizing a relay RLY1 causes the instrument on that PCB assembly 100 to be connected to the IC 450. In the example of FIG. 1, each PCB assembly 100 includes a PMOS transistor as M1. As such, the control signals CTL1-CTLn within the cables 410, 412 are normally of a sufficiently high voltage to prevent the M1s from being turned on and the relay driver 402 generates a sufficiently low voltage on a given conductor within cable 410, 412 to cause the corresponding M1 to turn on. The relay driver cables 410, 412 also can provide one or more supply voltages PWR1, PWR2, etc. for coupling to the sources of M1 on each PCB assembly 100.

The computer 400 configures the PCB assemblies 100 to connect one set of instruments 120 to the IC 450 for a given test, then automatically (i.e., without human involvement) reconfigure the PCBs 100 to connect a different set of instruments 120 to the IC 450 for another test, and so on. For each combination of instruments 120, the operation of the IC 450 is evaluated. For example, output data from the IC 450 can be stored for subsequent evaluation. The tests are specific to the IC 450 being tested.

Because connecting two PCB assemblies 100 together causes their ground and relay outputs to be connected together, the test assembly described herein is modular and scalable. FIG. 4 shows that a third PCB assembly 100f can be added to the second set 403 of PCBs if were desired to add a third instrument 120f to the second set 403. PCB assembly 100f is attached to PCB assembly 100d as shown and explained above. In addition to instrument 120f, PCB assembly 100f includes relay switch SW1f which can be activated to connect instrument 120f to the IC 450. Additional PCB assemblies 100 within a given set can be added or removed, and additional sets of PCB assemblies 100 can be provided as well depending on the capabilities of the IC 450 and its validation testing needs. The architecture described herein permits additional instruments to be added to an existing set of PCB assemblies simply connecting another PCB assembly 100 to an existing set of series-connected PCBs.

Figure 5:
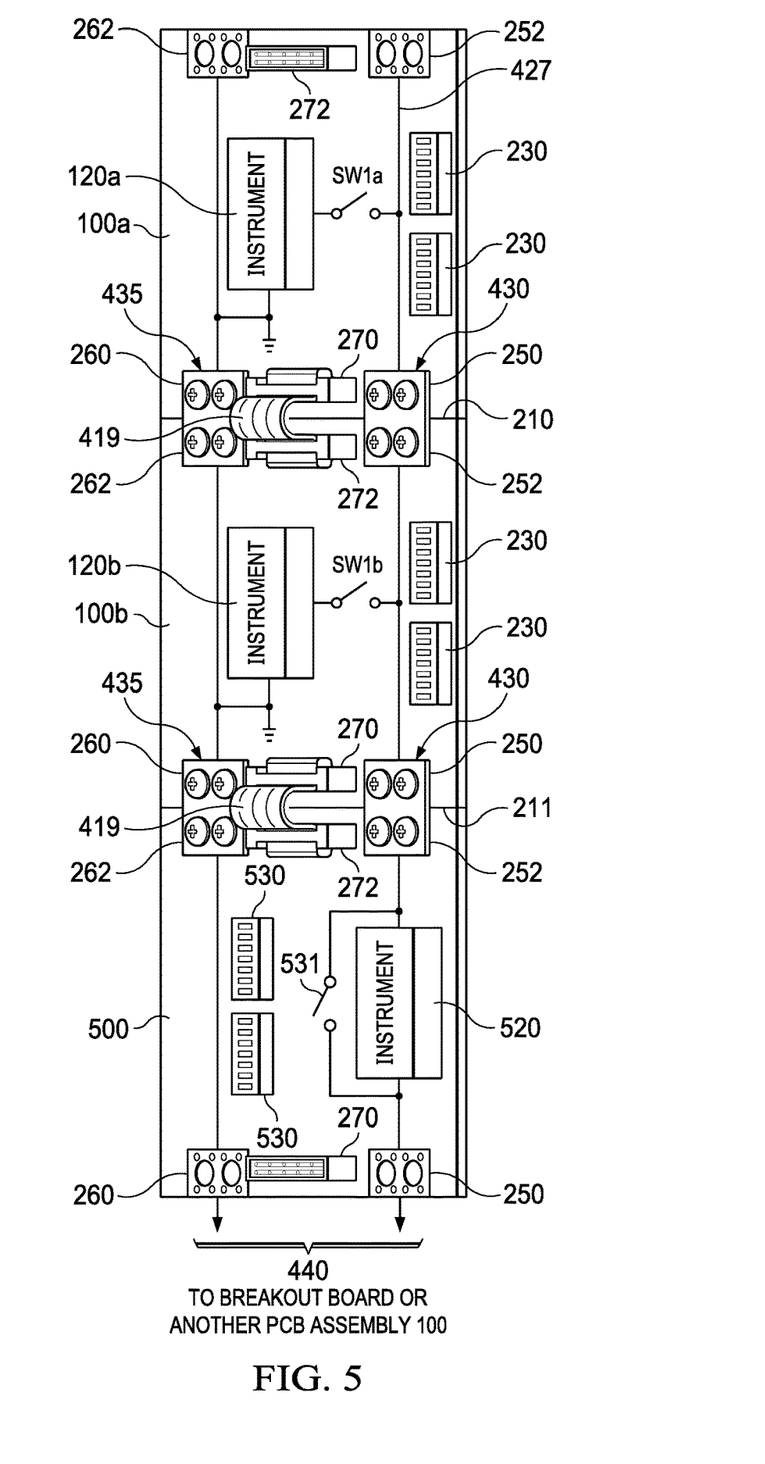
FIG. 5 shows an example of a test assembly including a series board.

FIG. 5 shows an example of two PCB assemblies 100a and 100b coupled to a series PCB assembly 500. Series PCB assembly is similar to the PCB assemblies described above except that the instrument 520 is connected between the electrical contacts 250 and 252. As such, the instrument is connected in series with the output from the other instruments 120*a*, 120*b* (on line 427). The relay coil's switch 531 on the series PCB assembly 500 is connected in parallel with the instrument 500. When closed, switch 531 shorts (bypasses) the instrument 500. When open, the switch 531 permits the instrument 500 be included in series with instruments 120*a*, 120*b*. The dip switches for series PCB assembly are generally the same as described above and are shown at 530.

The instrument 520 for a series PCB assembly 500 can be, for example, a sense resistor. In one example, during an efficiency test, the sense resistor is used to measure the voltage across the resistor (and thus the current) at lower current levels. At higher current levels, the sense resistor can be bypassed by closure of switch 531 using the relay board programmatically to avoid damaging the sense resistor. During a Vin-to-Vout short circuit test, it may be desirable to have a diode connected in series with the supply before shorting it to an output (this is a "break-the-part" test). The diode can be connected in-circuit by default. However during the efficiency test noted above where the input current accuracy is of greater concern, the diode can be bypassed programmatically to ensure that no energy is dissipated through the diode.

In this description, the term "couple" or "couples" means either an indirect or direct wired or wireless connection. Thus, if a first device couples to a second device, that connection may be through a direct connection or through an indirect connection via other devices and connections. The recitation "based on" means "based at least in part on." Therefore, if X is based on Y, X may be a function of Y and any number of other factors.

Modifications are possible in the described embodiments, and other embodiments are possible, within the scope of the claims.

What is claimed is:

1. A test assembly, comprising:
   a first plurality of circuit boards, each of the first plurality of circuit boards mechanically and electrically connected to at least one other of the first plurality of circuit boards;
   each of the first plurality of circuit boards includes:
      a plurality of pairs of electrically connectable contacts configurable to address their respective circuit board;
      an instrument;
      first and second multi-pin header connectors at opposing edges of their respective circuit board, each pin of the first multi-pin header connector electrically connected through the circuit board to a corresponding pin of the second multi-pin header;
      first and second input/output (I/O) terminals at the opposing edges of their respective circuit board, the first I/O terminal electrically connected through the circuit board to the second I/O terminal; and
      a relay including first and second coil terminals and first and second switch terminals, the first switch terminal electrically connected through their respective circuit board to the first and second I/O terminals and the second switch terminal electrically connected through their respective circuit board to the instrument;
   wherein each of the first plurality of circuit boards is mechanically and electrically connected to one other of the plurality of circuit boards through a jumper cable connecting the first multi-pin header connector of one circuit board to the second multi-pin header connector of another circuit board and through a conductive member electrically connecting the first I/O terminal of one circuit board to the second I/O terminal of another circuit board.

2. The test assembly of claim 1, wherein the instrument comprises at least one of a power supply, a load, a function generator, an oscilloscope, and a frequency response analyzer.

3. The test assembly of claim 1, wherein each circuit board first plurality of circuit boards comprises:
   a transistor having a control input, a first current terminal and a second current terminal, the control input coupled to at least some of the electrically connectable contacts, the second current terminal connected to the first coil terminal, the second coil terminal connected to a ground node; and
   a first resistor connected between the control input and the first current terminal.

4. The test assembly of claim 3, further comprising a second resistor connected between the second current terminal and the ground node.

5. The test assembly of claim 3, wherein a different pair of the least some of the electrically connectable contacts are electrically connected together on each of the first plurality of circuit boards.

6. The test assembly of claim 1, wherein each of the first and second multi-pin header connectors includes a first plurality of pins to receive control signals and a second plurality of pins to receive supply voltages, and each pin of the first multi-pin header connector electrically connects to a corresponding electrically connectable contact of the plurality of electrically connectable contacts as well as to a corresponding pin of the second multi-pin header.

7. The test assembly of claim 1, further comprising a breakout board connected to a second I/O terminal of one of the first plurality of circuit boards.

8. The test assembly of claim 1, further comprising a second plurality of circuit boards, each of the second plurality of circuit boards mechanically and electrically connected to one other of the second plurality of circuit boards and each of the second plurality of circuits including a plurality of pairs of electrically connectable contacts, an instrument, a relay, and first and second I/O terminals at opposing edges of their respective circuit board, the first I/O terminal electrically connected through the circuit board to the second I/O terminal, and a breakout board connected to the second I/O terminal of one of the second plurality of circuit boards.

9. The test assembly of claim 8, wherein each of the instruments on the first plurality of circuit boards comprises an input device or power supply, and each of the instruments on the second plurality of circuit boards comprises a load or measurement device.

10. The test assembly of claim 8, further comprising a validation board including an integrated circuit to be tested, the validation board connected to the breakout board.

11. A circuit board assembly, comprising: a printed circuit board (PCB);
   a plurality of dip switches attached to the PCB;
   first and second multi-pin header connectors at opposing edges of the PCB, each pin of the first multi-pin header connector electrically connected through the PCB to a corresponding pin of the second multi-pin header connector;

first and second input/output (I/O) terminals at the opposing edges of the PCB, the first I/O terminal electrically connected through the PCB to the second I/O terminal; and a relay attached to the PCB, the relay including first and second coil terminals and first and second switch terminals, the first switch terminal electrically connected through the PCB to the first and second I/O terminals.

12. The circuit board assembly of claim 11, further comprising an instrument attached to the PCB and the second switch terminal electrically connected through the PCB to the instrument.

13. The circuit board assembly of claim 11, wherein the instrument is at least one of a power supply, a load, a measurement device, function generator, an oscilloscope, or a frequency response analyzer.

14. The circuit board assembly of claim 11, further comprising a transistor having a control input, a first current terminal and a second current terminal, the control input coupled to the input control dip switches, the second current terminal connected to the first coil terminal, the second coil terminal connected to a ground node.

15. The circuit board assembly of claim 14, further comprising a first resistor connected between the control input and the first current terminal.

16. The circuit board assembly of claim 14, further comprising a second resistor connected between the second current terminal and the ground node.

17. The circuit board assembly of claim 11, wherein each of the first and second multi pin headers includes a first plurality of pins to receive control signals and a second plurality of pins to receive supply voltages, and each pin of the first multi-pin header connector electrically connects to a corresponding dip switch of the plurality of dip switches as well as to a corresponding pin of the second multi-pin header.

18. A test assembly, comprising:
a first plurality of circuit boards, each of the first plurality of circuit boards mechanically and electrically connected to one other of the first plurality of circuit boards;

each of the plurality of circuit boards includes:
a plurality of dip switches configurable to address their respective circuit board;
first and second input/output (I/O) terminals at the opposing edges of their respective circuit board, the first I/O terminal electrically connected through the circuit board to the second I/O terminal; and
a relay including first and second coil terminals and first and second switch terminals, the first switch terminal electrically connected through their respective circuit board to the first and second I/O terminals;
wherein each of the first plurality of circuit boards mechanically and electrically connected to one other of the plurality of circuit boards through a conductive member electrically connecting the first I/O terminal of one circuit board to the second I/O terminal of another circuit board.

19. The test assembly of claim 18, wherein each of the plurality of circuit boards comprises first and second multi-pin header connectors at opposing edges of their respective circuit board, each pin of the first multi-pin header connector electrically connected through their respective circuit board to a corresponding pin of the second multi-pin header connector.

20. The test assembly of claim 19, wherein each of the pins of the first multi-pin header connector connects through their respective circuit board to a corresponding dip switch as well as to the corresponding pin of the second multi-pin header connector.

21. The test assembly of claim 18, further including a series circuit board mechanically and electrically coupled to one of the first plurality of circuit boards, the series circuit board including
a plurality of dip switches configurable to address the series circuit board;
first and second I/O terminals at opposing edges of the series circuit board;
an instrument connected between the first and second I/O terminals; and
a relay including a coil and a switch, the switch connected in parallel with the instrument between the first and second I/O terminals.

* * * * *